(12) United States Patent
DeShazo et al.

(10) Patent No.: US 12,447,329 B2
(45) Date of Patent: Oct. 21, 2025

(54) SYSTEMS AND METHODS FOR DETECTING PULSE PATTERNS

(71) Applicant: Advanced Neuromodulation Systems, Inc., Plano, TX (US)

(72) Inventors: Daran DeShazo, Lewisville, TX (US); Gavin Rade, Dallas, TX (US)

(73) Assignee: ADVANCED NEUROMODULATION SYSTEMS, INC, Plano, TX (US)

( * ) Notice: Subject to any disclaimer, the term of this patent is extended or adjusted under 35 U.S.C. 154(b) by 647 days.

(21) Appl. No.: 17/673,091

(22) Filed: Feb. 16, 2022

(65) Prior Publication Data
US 2023/0256234 A1 Aug. 17, 2023

(51) Int. Cl.
*A61N 1/02* (2006.01)
*A61N 1/36* (2006.01)

(52) U.S. Cl.
CPC .......... *A61N 1/025* (2013.01); *A61N 1/36125* (2013.01); *A61N 1/36153* (2013.01); *A61N 1/36171* (2013.01); *A61N 1/36175* (2013.01); *A61N 1/36178* (2013.01); *A61N 1/36067* (2013.01); *A61N 1/36071* (2013.01)

(58) Field of Classification Search
CPC ................ A61N 1/025; A61N 1/36125; A61N 1/36153; A61N 1/36171; A61N 1/36175; A61N 1/36178; A61N 1/36067; A61N 1/36071; H02M 1/36; H02M 3/07; H02M 1/0012; H03K 19/20; H03K 3/0315; H03K 5/134; H03K 5/26; A61B 5/0066; A61B 5/0073; G01B 9/02004; G01B 9/02069; G01B 9/02091; G01B 2290/25; G01B 2290/45; G01B 2290/60; G01B 9/02027; G01B 9/02043; G01B 9/02083
See application file for complete search history.

(56) References Cited

U.S. PATENT DOCUMENTS

| | | | |
|---|---|---|---|
| 4,436,093 A * | 3/1984 | Belt | A61N 1/365 607/9 |
| 7,369,897 B2 | 5/2008 | Boveja et al. | |
| 7,493,172 B2 | 2/2009 | Whitehurst et al. | |
| 8,340,771 B2 | 12/2012 | Thimineur et al. | |
| 8,626,302 B2 | 1/2014 | Bennett et al. | |

(Continued)

*Primary Examiner* — Carl H Layno
*Assistant Examiner* — Anh-Khoa N Dinh
(74) *Attorney, Agent, or Firm* — Armstrong Teasdale LLP

(57) ABSTRACT

Pulse pattern detecting circuitry for use with a fractional voltage multiplier of a neurostimulation system is provided. The pulse pattern detecting circuitry is configured to detect an initial overlap of a repeating pulse pattern, wherein the repeating pulse pattern is generated by a plurality of pulse engines that generate pulses at different frequencies, the initial overlap occurring when pulses generated by each of the plurality of pulse engines occur simultaneously, detect a subsequent overlap of the repeating pulse pattern, the subsequent overlap of the pulse pattern occurring when pulses generated by each of the plurality of pulse engines again occur simultaneously, detect a plurality of events between the initial overlap and the subsequent overlap, each event corresponding to at least one of the plurality of pulse engines generating a pulse, and record a voltage multiplier setting for each of the plurality of detected events.

18 Claims, 4 Drawing Sheets

(56) References Cited

U.S. PATENT DOCUMENTS

2005/0102006 A1 5/2005 Whitehurst et al.
2019/0353787 A1* 11/2019 Petit ........................ G01S 7/484
2020/0321948 A1* 10/2020 Bose ..................... H02M 3/155
2020/0360697 A1* 11/2020 Paoles ................ A61N 1/36128
2021/0023373 A1* 1/2021 DeShazo .............. A61N 1/3787

* cited by examiner

SYSTEMS AND METHODS FOR DETECTING PULSE PATTERNS

FIELD OF THE DISCLOSURE

The present disclosure relates generally to neurostimulation systems, and more particularly to pulse pattern detecting circuitry for detecting the length of a repeating pulse pattern.

BACKGROUND ART

Neurostimulation is an established neuromodulation therapy for the treatment of chronic pain and movement disorders. For example, neurostimulation has been shown to improve cardinal motor symptoms of Parkinson's Disease (PD), such as bradykinesia, rigidity, and tremors. Types of neurostimulation include deep brain stimulation (DBS) and spinal cord stimulation (SCS).

In some neurostimulation systems, a multi-engine approach is utilized, where multiple separate stimulation engines each generate pulses at an independent frequency. This enables delivering complex stimulation programs, particularly when delivering different pulses using different electrodes.

When delivering multiple stimulation pulses to different electrodes at different frequencies, low power operation is achieved by delivering each pulse or combination of pulses from an optimum supply voltage. To address this, a fractional voltage multiplier may be used to provide different supply voltages for different pulses.

To facilitate optimization, and to avoid significant computational burdens, the length and repetition of the particular pulse pattern should be communicated to the fractional voltage multiplier. However, in at least some known systems, it is not possible to determine when a complex pulse pattern (e.g., including pulses delivered at different electrodes at different frequencies) repeats itself. Accordingly, it would be desirable to be able to detect when complex pulse patterns repeat themselves, to facilitate use of a fractional voltage multiplier that is adjusted from one iteration of a repeating pattern to the next.

BRIEF SUMMARY OF THE DISCLOSURE

In one aspect, pulse pattern detecting circuitry for use with a fractional voltage multiplier of a neurostimulation system is provided. The pulse pattern detecting circuitry is configured to detect an initial overlap of a repeating pulse pattern, wherein the repeating pulse pattern is generated by a plurality of pulse engines that generate pulses at different frequencies, the initial overlap occurring when pulses generated by each of the plurality of pulse engines occur simultaneously, detect a subsequent overlap of the repeating pulse pattern, the subsequent overlap of the pulse pattern occurring when pulses generated by each of the plurality of pulse engines again occur simultaneously, detect a plurality of events between the initial overlap and the subsequent overlap, each event corresponding to at least one of the plurality of pulse engines generating a pulse, and record a voltage multiplier setting for each of the plurality of detected events.

In another aspect, a neurostimulation system is provided. The neurostimulation system includes a plurality of pulse engines configured to generate a repeating pulse pattern by generating pulses at different frequencies, and pulse pattern detecting circuitry coupled to the plurality of pulse engines, the pulse pattern detecting circuitry configured to detect an initial overlap of the repeating pulse pattern, the initial overlap occurring when pulses generated by each of the plurality of pulse engines occur simultaneously, detect a subsequent overlap of the repeating pulse pattern, the subsequent overlap of the pulse pattern occurring when pulses generated by each of the plurality of pulse engines again occur simultaneously, detect a plurality of events between the initial overlap and the subsequent overlap, each event corresponding to at least one of the plurality of pulse engines generating a pulse, and record a voltage multiplier setting for each of the plurality of detected events.

In yet another aspect, a method of operating a neurostimulation system is provided. The method includes generating a repeating pulse pattern using a plurality of pulse engines that generate pulses at different frequencies, detecting, using pulse pattern detecting circuitry, an initial overlap of the repeating pulse pattern, the initial overlap occurring when pulses generated by each of the plurality of pulse engines occur simultaneously, detecting, using the pulse pattern detecting circuitry, a subsequent overlap of the repeating pulse pattern, the subsequent overlap of the pulse pattern occurring when pulses generated by each of the plurality of pulse engines again occur simultaneously, detecting, using the pulse pattern detecting circuitry, a plurality of events between the initial overlap and the subsequent overlap, each event corresponding to at least one of the plurality of pulse engines generating a pulse, and recording, using the pulse pattern detecting circuitry, a voltage multiplier setting for each of the plurality of detected events.

The foregoing and other aspects, features, details, utilities and advantages of the present disclosure will be apparent from reading the following description and claims, and from reviewing the accompanying drawings.

BRIEF DESCRIPTION OF THE DRAWINGS

Corresponding reference characters indicate corresponding parts throughout the several views of the drawings.

DETAILED DESCRIPTION OF THE DISCLOSURE

Figure 1:
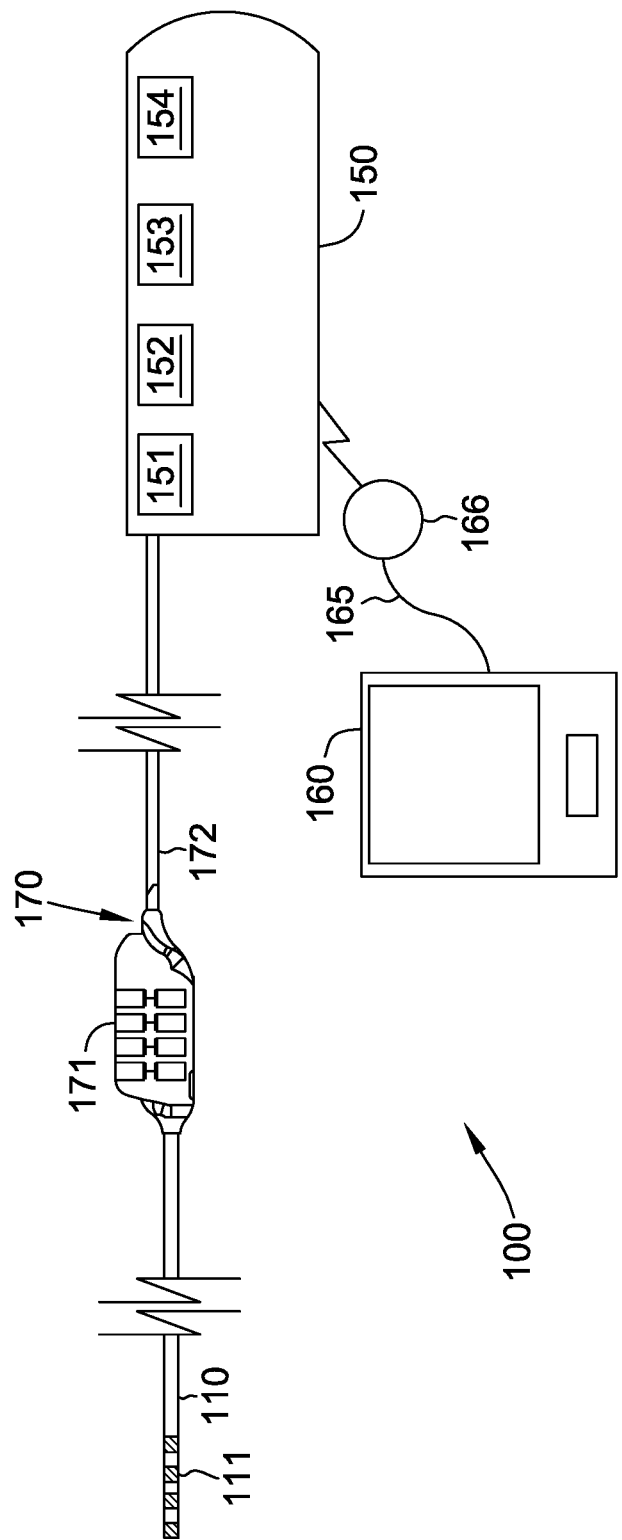
FIG. 1 is a schematic view of one embodiment of a stimulation system.

The present disclosure provides systems and methods for pulse pattern detecting circuitry of a neurostimulation system. The pulse pattern detecting circuitry is configured to detect an initial overlap of a repeating pulse pattern, wherein the repeating pulse pattern is generated by a plurality of pulse engines that generate pulses at different frequencies, the initial overlap occurring when pulses generated by each of the plurality of pulse engines occur simultaneously. The pulse pattern circuitry is further configured to detect a subsequent overlap of the repeating pulse pattern, the subsequent overlap of the pulse pattern occurring when pulses generated by each of the plurality of pulse engines again occur simultaneously, detect a plurality of events between the initial overlap and the subsequent overlap, each event corresponding to at least one of the plurality of pulse engines generating a pulse, and record a voltage multiplier setting for each of the plurality of detected events.

Neurostimulation systems are devices that generate electrical pulses and deliver the pulses to nervous tissue of a patient to treat a variety of disorders. One category of neurostimulation systems is deep brain stimulation (DBS). In DBS, pulses of electrical current are delivered to target regions of a subject's brain, for example, for the treatment of movement and effective disorders such as PD and essential tremor. Additional categories of neurostimulation systems are spinal cord stimulation (SCS) and Dorsal Root Ganglion (DRG) stimulation for chronic pain.

Neurostimulation systems generally include a pulse generator and one or more leads. A stimulation lead includes a lead body of insulative material that encloses wire conductors. The distal end of the stimulation lead includes multiple electrodes, or contacts, that intimately impinge upon patient tissue and are electrically coupled to the wire conductors. The proximal end of the lead body includes multiple terminals (also electrically coupled to the wire conductors) that are adapted to receive electrical pulses. In DBS systems, the distal end of the stimulation lead is implanted within the brain tissue to deliver the electrical pulses. The stimulation leads are then tunneled to another location within the patient's body to be electrically connected with a pulse generator or, alternatively, to an "extension." The pulse generator is typically implanted in the patient within a subcutaneous pocket created during the implantation procedure.

The pulse generator is typically implemented using a metallic housing (or can) that encloses circuitry for generating the electrical stimulation pulses, control circuitry, communication circuitry, a rechargeable battery, etc. The pulse generating circuitry is coupled to one or more stimulation leads through electrical connections provided in a "header" of the pulse generator. Specifically, feedthrough wires typically exit the metallic housing and enter into a header structure of a moldable material. Within the header structure, the feedthrough wires are electrically coupled to annular electrical connectors. The header structure holds the annular connectors in a fixed arrangement that corresponds to the arrangement of terminals on the proximal end of a stimulation lead.

Referring now to the drawings, and in particular to FIG. 1, a stimulation system is indicated generally at 100. Stimulation system 100 generates electrical pulses for application to tissue of a patient, or subject, according to one embodiment. System 100 includes an implantable pulse generator (IPG) 150 that is adapted to generate electrical pulses for application to tissue of a patient. Alternatively, system 100 may include an external pulse generator (EPG) positioned outside the patient's body. IPG 150 typically includes a metallic housing (or can) that encloses a controller 151, pulse generating circuitry 152, a battery 153, far-field and/or near field communication circuitry 154, and other appropriate circuitry and components of the device. Controller 151 typically includes a microcontroller or other suitable processor for controlling the various other components of the device. Software code is typically stored in memory of IPG 150 for execution by the microcontroller or processor to control the various components of the device.

IPG 150 may comprise one or more attached extension components 170 or be connected to one or more separate extension components 170. Alternatively, one or more stimulation leads 110 may be connected directly to IPG 150. Within IPG 150, electrical pulses are generated by pulse generating circuitry 152 and are provided to switching circuitry. The switching circuit connects to output wires, traces, lines, or the like (not shown) which are, in turn, electrically coupled to internal conductive wires (not shown) of a lead body 172 of extension component 170. The conductive wires, in turn, are electrically coupled to electrical connectors (e.g., "Bal-Seal" connectors) within connector portion 171 of extension component 170. The terminals of one or more stimulation leads 110 are inserted within connector portion 171 for electrical connection with respective connectors. Thereby, the pulses originating from IPG 150 and conducted through the conductors of lead body 172 are provided to stimulation lead 110. The pulses are then conducted through the conductors of lead 110 and applied to tissue of a patient via electrodes 111. Any suitable known or later developed design may be employed for connector portion 171.

For implementation of the components within IPG 150, a processor and associated charge control circuitry for an implantable pulse generator is described in U.S. Pat. No. 7,571,007, entitled "SYSTEMS AND METHODS FOR USE IN PULSE GENERATION," which is incorporated herein by reference. Circuitry for recharging a rechargeable battery of an implantable pulse generator using inductive coupling and external charging circuits are described in U.S. Pat. No. 7,212,110, entitled "IMPLANTABLE DEVICE AND SYSTEM FOR WIRELESS COMMUNICATION," which is incorporated herein by reference.

An example and discussion of "constant current" pulse generating circuitry is provided in U.S. Patent Publication No. 2006/0170486 entitled "PULSE GENERATOR HAVING AN EFFICIENT FRACTIONAL VOLTAGE CONVERTER AND METHOD OF USE," which is incorporated herein by reference. One or multiple sets of such circuitry may be provided within IPG 150. Different pulses on different electrodes may be generated using a single set of pulse generating circuitry using consecutively generated pulses according to a "multi-stimset program" as is known in the art. Alternatively, multiple sets of such circuitry may be employed to provide pulse patterns that include simultaneously generated and delivered stimulation pulses through various electrodes of one or more stimulation leads as is also known in the art. Various sets of parameters may define the pulse characteristics and pulse timing for the pulses applied to various electrodes as is known in the art. Although constant current pulse generating circuitry is contemplated for some embodiments, any other suitable type of pulse generating circuitry may be employed such as constant voltage pulse generating circuitry.

Stimulation lead(s) 110 may include a lead body of insulative material about a plurality of conductors within the material that extend from a proximal end of lead 110 to its distal end. The conductors electrically couple a plurality of electrodes 111 to a plurality of terminals (not shown) of lead 110. The terminals are adapted to receive electrical pulses and the electrodes 111 are adapted to apply stimulation pulses to tissue of the patient. Also, sensing of physiological signals may occur through electrodes 111, the conductors, and the terminals. Additionally or alternatively, various sensors (not shown) may be located near the distal end of stimulation lead 110 and electrically coupled to terminals through conductors within the lead body 172. Stimulation lead 110 may include any suitable number and type of electrodes 111, terminals, and internal conductors.

Controller device 160 may be implemented to recharge battery 153 of IPG 150 (although a separate recharging device could alternatively be employed). A "wand" 165 may be electrically connected to controller device through suitable electrical connectors (not shown). The electrical connectors are electrically connected to coil 166 (the "primary" coil) at the distal end of wand 165 through respective wires (not shown). Typically, coil 166 is connected to the wires through capacitors (not shown). Also, in some embodiments, wand 165 may comprise one or more temperature sensors for use during charging operations.

The patient then places the primary coil 166 against the patient's body immediately above the secondary coil (not shown), i.e., the coil of the implantable medical device. Preferably, the primary coil 166 and the secondary coil are aligned in a coaxial manner by the patient for efficiency of the coupling between the primary and secondary coils. Controller device 160 generates an AC-signal to drive current through coil 166 of wand 165. Assuming that primary coil 166 and secondary coil are suitably positioned relative to each other, the secondary coil is disposed within the magnetic field generated by the current driven through primary coil 166. Current is then induced by a magnetic field in the secondary coil. The current induced in the coil of the implantable pulse generator is rectified and regulated to recharge the battery of IPG 150. The charging circuitry may also communicate status messages to controller device 160 during charging operations using pulse-loading or any other suitable technique. For example, controller device 160 may communicate the coupling status, charging status, charge completion status, etc.

External controller device 160 is also a device that permits the operations of IPG 150 to be controlled by a user after IPG 150 is implanted within a patient, although in alternative embodiments separate devices are employed for charging and programming. Also, multiple controller devices may be provided for different types of users (e.g., the patient or a clinician). Controller device 160 can be implemented by utilizing a suitable handheld processor-based system that possesses wireless communication capabilities. Software is typically stored in memory of controller device 160 to control the various operations of controller device 160. Also, the wireless communication functionality of controller device 160 can be integrated within the handheld device package or provided as a separate attachable device. The interface functionality of controller device 160 is implemented using suitable software code for interacting with the user and using the wireless communication capabilities to conduct communications with IPG 150.

Controller device 160 preferably provides one or more user interfaces to allow the user to operate IPG 150 according to one or more stimulation programs to treat the patient's disorder(s). Each stimulation program may include one or more sets of stimulation parameters including pulse amplitude, pulse width, pulse frequency or inter-pulse period, pulse repetition parameter (e.g., number of times for a given pulse to be repeated for respective stimset during execution of program), etc. In the methods and systems described herein, stimulation parameters may include, for example, a number of pulses in a burst (e.g., 3, 4, or 5 pulses per burst), an intra-burst frequency (e.g., 500 Hz), an inter-burst frequency (e.g., 40 Hz), and a delay between the pulses in a burst (e.g., less than 1 millisecond (ms)).

IPG 150 modifies its internal parameters in response to the control signals from controller device 160 to vary the stimulation characteristics of stimulation pulses transmitted through stimulation lead 110 to the tissue of the patient. Neurostimulation systems, stimsets, and multi-stimset programs are discussed in PCT Publication No. WO 2001/093953, entitled "NEUROMODULATION THERAPY SYSTEM," and U.S. Pat. No. 7,228,179, entitled "METHOD AND APPARATUS FOR PROVIDING COMPLEX TISSUE STIMULATION PATTERNS," which are incorporated herein by reference. Example commercially available neurostimulation systems include the EON MINI™ pulse generator and RAPID PROGRAMMER™ device from Abbott Laboratories.

In some embodiments, IPG 150 is implemented using a multi-engine approach, in which multiple separate engines each generate pulses at an independent frequency. This enables delivering complex stimulation programs (e.g., delivering different pulses using different electrodes).

When delivering multiple stimulation pulses to different electrodes at different frequencies, a target supply voltage for each pulse or combination of pulses varies. To address this, a fractional voltage multiplier may be used to provide different supply voltages for different pulses. To effectively implement the fractional voltage multiplier, the length and repetition of the particular pulse pattern should be communicated to the fractional voltage multiplier.

Accordingly, the systems and methods described herein provide pulse pattern detecting circuitry that is capable of detecting when complex pulse patterns repeat themselves. The pulse pattern detecting circuitry is capable of learning where repetition of a delivered pulse pattern occurs, enabling voltage multiplier settings to be optimized for each stimulation event independently. In some embodiments, the pulse pattern detecting circuitry is incorporated into IPG 150. Alternatively, the pulse pattern detecting circuitry may be implemented in any suitable device.

The pulse pattern detecting circuitry may be used with single- or multi-engine stimulation schemes, and enables detecting repetition patterns without pre-computing individual pulse intervals.

In one embodiment, the pulse pattern detecting circuitry records an event for each stimulation pulse or combination of simultaneous stimulation pulses. The pulse pattern detecting circuitry increments a counter for each event, such that each unique count corresponds to a unique voltage multiplier setting (corresponding to the pulse or pulses associated with that event).

To determine the length of the pulse pattern (i.e., how often the pattern repeats), all stimulation engines are activated simultaneously so that the leading edges of the pulses overlap. Then, the pulse pattern detecting circuitry detects when this overlap of all pulses occurs again. The period of time between the overlaps defines the length of the pulse pattern and number of voltage multiplier settings for the pulse pattern (corresponding to the number of times the counter was incremented between overlaps). If a limit of the counter is exceeded, the pattern is restarted, ensuring repetition. The overlaps may be thought of as a "beat" of the pulse pattern, with the frequency of the overlaps effectively being a beat frequency.

Using the pulse pattern detecting circuitry described herein, a single fractional voltage multiplier may be used with multiple engines, without requiring additional components for multiple voltage sources. Further, the pulse pattern detecting circuitry improves power savings and programming simplicity. The pulse pattern detecting circuitry may be implemented within, for example, IPG 150 (shown in FIG. 1).

Figure 2:
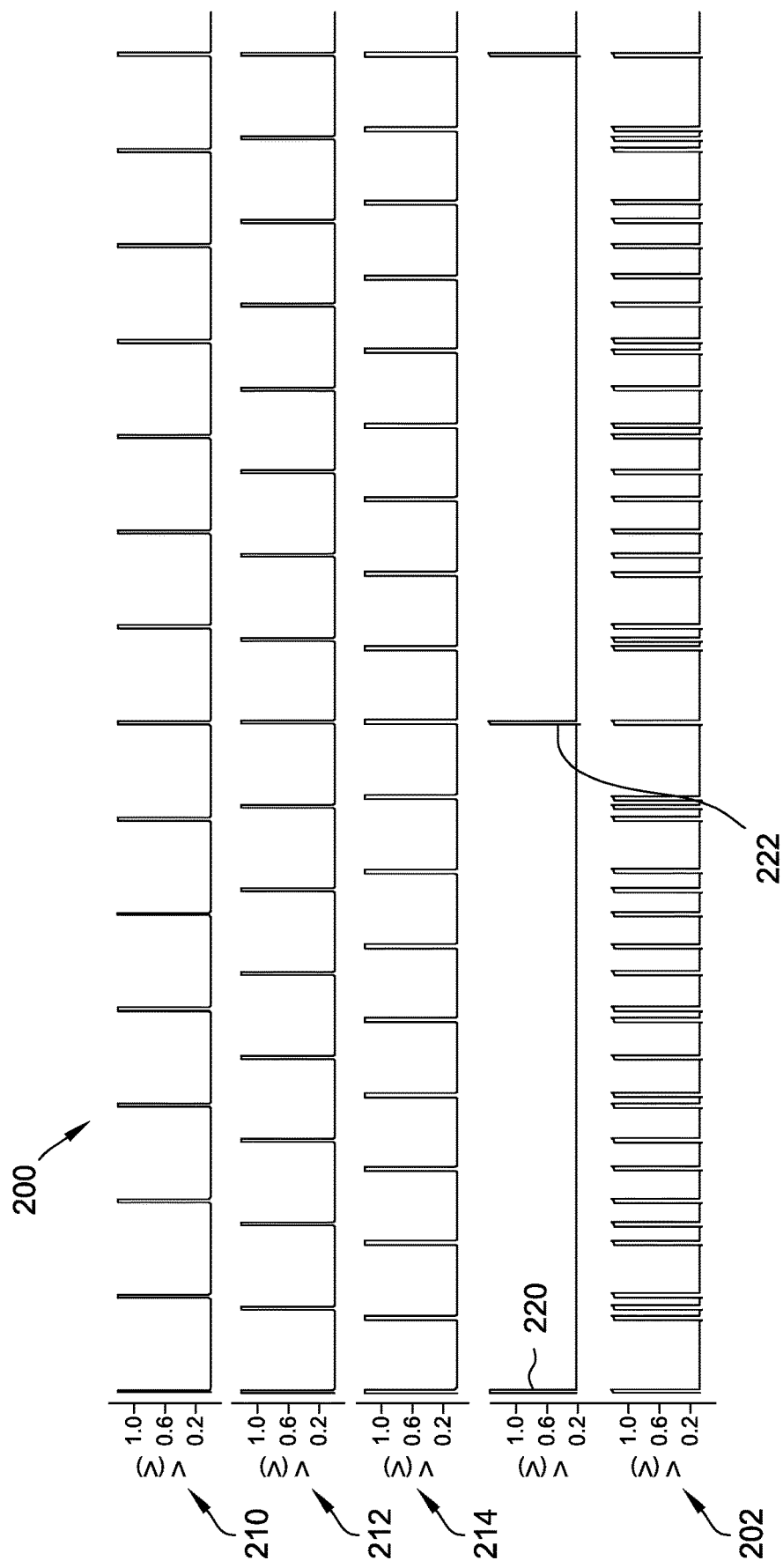
FIG. 2 is a diagram illustrating an example pulse pattern.

FIG. 2 is a diagram 200 illustrating an example pulse pattern 202. As shown in FIG. 2, pulse pattern 202 is the combination of a first pulse engine pattern 210, a second pulse engine pattern 212, and a third pulse engine pattern 214. Each pulse engine pattern 210, 212, and 214 includes pulses that are repeated at a different frequency. Further, the pulses of pulse engine patterns 210, 212, and 214 may be delivered using the same electrode or different electrodes.

As explained above, and as shown in FIG. 2, the pulse engines associated with pulse engine patterns 210, 212, and 214 are activated at the same time so that the leading edges of pulses from each pulse engine pattern 210, 212, 214 occur simultaneously at an initial overlap 220.

After a period of time, the leading edges of the pulses from each pulse engine pattern 210, 212, 214 again occur simultaneously at a subsequent overlap 222.

The pulse pattern detecting circuitry detects the amount of time between initial overlap 220 and subsequent overlap 222, thus detecting a length of pulse pattern 202. Further, for each event between initial overlap 220 and subsequent overlap 222, the pulse pattern detecting circuitry records an associated voltage multiplier setting. Accordingly, once pulse pattern 202 proceeds beyond subsequent overlap 222 and begins to repeat, the pulse pattern detecting circuity has learned the length of pulse pattern 202, and logged every event that occurs over the length of pulse pattern 202 with an associated voltage multiplier setting.

During the initial pulse pattern, while the pulse pattern detecting circuity is learning the length and voltage multiplier settings, in one embodiment, the voltage of the pulse generator is maintained at a sufficiently high voltage to cover satisfy all possible voltage multiplier settings. In an alternative embodiment, during the initial pulse pattern, the voltage of the pulse generator is initially set to a high voltage, and lowered down each time the pattern repeats. In yet another alternative embodiment, during the initial pulse pattern, the voltage of the pulse generator is initially set to a low voltage, and ramped up as events occur.

Figure 3:
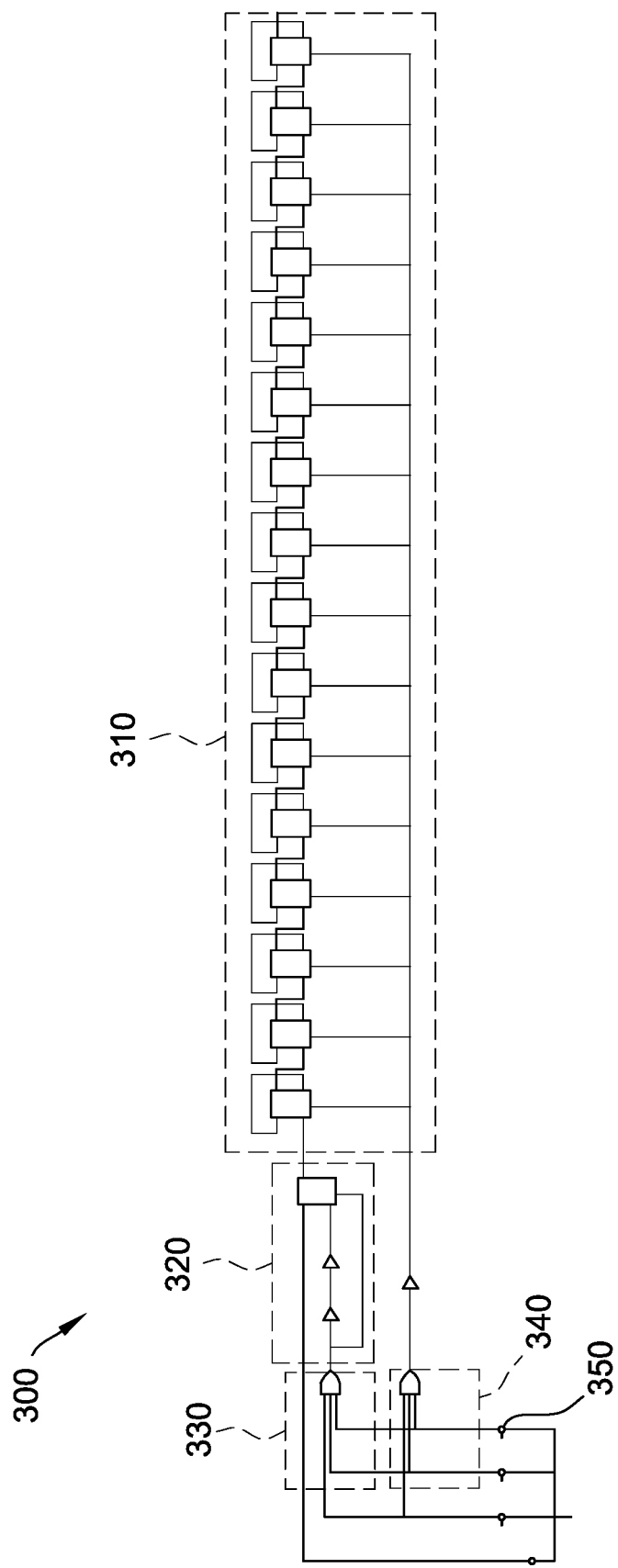
FIG. 3 is a circuit diagram of one embodiment of pulse pattern detecting circuitry.

FIG. 3 is a circuit diagram of one embodiment of pulse pattern detecting circuitry 300. Pulse pattern detecting circuitry 300 is an analog implementation in this embodiment. Alternatively, the pulse pattern detecting circuitry described herein may be implemented digitally (see, e.g., FIG. 4). Pulse pattern detecting circuitry 300 is capable of detecting a pulse pattern generated using up to three separate stimulation engines.

Pulse pattern detecting circuitry 300 includes a counter circuit 310 that increments each time an event occurs, so that each event can be assigned a unique voltage multiplier setting. In the embodiment shown, counter circuit 310 is a ripple counter including D Flip-Flops. However, those of skill in the art will appreciate that counter circuit 310 may alternatively be implemented using Toggle Flip-Flops and/or a synchronous design.

Pulse pattern detecting circuitry 300 further includes a pulse generating circuit 320 used to increment counter circuit 310 when the logic at its input asserts. Further, first and second logic circuits 330 and 340 determine when counter circuit 310 is incremented or reset.

In this embodiment, first logic circuit 330 is an OR function that includes pulse signals 350 from each stimulation engine as an input. In this example, there are three pulse signals 350 (corresponding to three stimulation engines). Alternatively, any number of pulse signals may be inputs to first logic circuit 330. The OR function of first logic circuit 330 asserts whenever any of the pulse signals 350 produce a pulse, causing pulse generating circuit 320 to generate a corresponding pulse, which in turn causes counter circuit 310 to increment and produce a new unique setting index for the fractional voltage multiplier.

Second logic circuit 340, in this embodiment, is an AND function that asserts when all pulse signals 350 produce a pulse simultaneously. This AND function causes counter circuit 310 to reset, indicating that the pulse pattern is repeating, and allowing the fractional voltage multiplier to optimize its settings based on repetitions of the pulse pattern.

Figure 4:
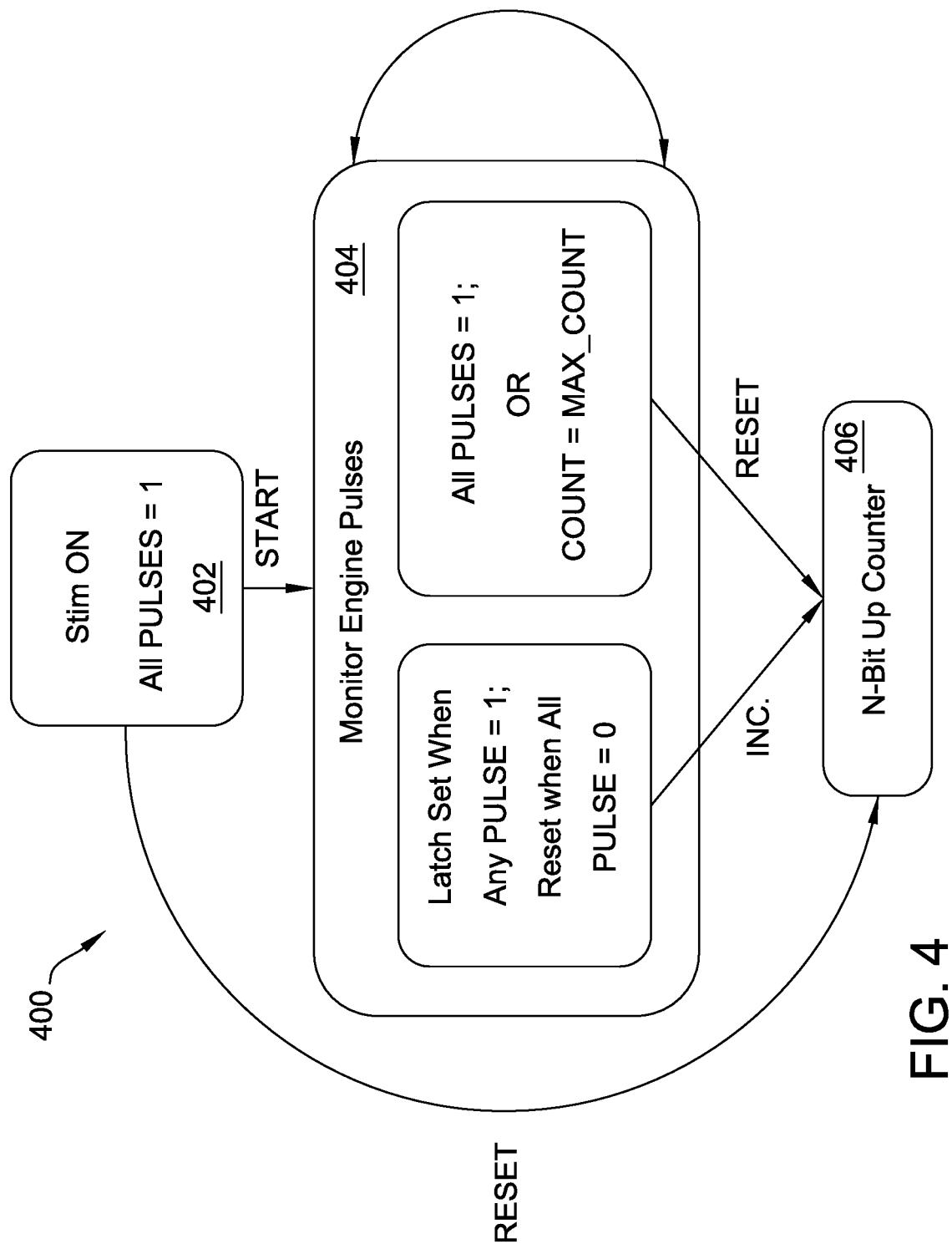
FIG. 4 is a state diagram of another embodiment of pulse pattern detecting circuitry.

FIG. 4 is a state diagram of another embodiment of pulse pattern detecting circuitry 400. Pulse pattern detecting circuitry 400 is a digital implementation in this embodiment. Pulse pattern detecting circuitry 400 is capable of detecting a pulse pattern generating using up to eight separate stimulation engines.

More specifically, pulse pattern detecting circuitry 400 is an example of a potential digital implementation that could be implemented in Verilog, VHDL, or a similar hardware description language. When stimulation is initiated, at block 402, the system enters the Stim ON state. Further, all engine pulse signals are aligned in time and the effective "beat" signal occurs (represented as "All PULSES=1"). The beat signal may be produced by a combinational logic circuit such as an OR gate. Further, a pulse generator may detect that all PULSE rising edges are coincident, or can define that the rising edges are all within a predefined number of clock edges from one another.

Once the pulse pattern is started the PULSE signals from each stimulation engine are monitored at block 404. When any PULSE signal asserts, a latch circuit (e.g., a D Flip Flop, an SR Latch, or another similar function) is set. This assertion the latch output will send an increment (INC) signal to an N-Bit Up Counter that is tracking events at block 406.

This latch circuit does not reset until ALL PULSE signals have returned to 0, ensuring that a single event signal corresponds to any combination of pulses and gives the fractional voltage multiplier time to recharge and re-configure between events. This monitoring operation repeats until either the maximum count (MAX_COUNT) is reached or the beat signal (All PULSES=1) occurs again. In either of those cases, a counter RESET signal is generated. The repetition of this collision will send the RESET signal to the N-Bit Up Counter and signifies that the pattern has completed and can now repeat. One this pattern is repeating, and the event counter is cycling from 0 to M (number of events in the pattern), it is possible to adjust the output of the fractional voltage multiplier appropriately for each event. Those of skill in the art will appreciate that pulse pattern detecting circuitry 400 is only an example, and that any suitable digital implementation may be used.

The embodiments described herein provide systems and methods for pulse pattern detecting circuitry of a neurostimulation system. The pulse pattern detecting circuitry is configured to detect an initial overlap of a repeating pulse pattern, wherein the repeating pulse pattern is generated by a plurality of pulse engines that generate pulses at different frequencies, the initial overlap occurring when pulses generated by each of the plurality of pulse engines occur simultaneously. The pulse pattern circuitry is further configured to detect a subsequent overlap of the repeating pulse pattern, the subsequent overlap of the pulse pattern occurring when pulses generated by each of the plurality of pulse engines again occur simultaneously, detect a plurality of events between the initial overlap and the subsequent overlap, each event corresponding to at least one of the plurality of pulse engines generating a pulse, and record a voltage multiplier setting for each of the plurality of detected events.

Although certain embodiments of this disclosure have been described above with a certain degree of particularity, those skilled in the art could make numerous alterations to the disclosed embodiments without departing from the spirit or scope of this disclosure. All directional references (e.g., upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of the disclosure. Joinder references (e.g., attached, coupled, connected, and the like) are to be construed broadly and may include intermediate members between a connection of elements and relative movement between elements. As such, joinder references do not necessarily infer that two elements are directly connected and in fixed relation to each other. It is intended that all matter contained in the above description or shown in the accompanying drawings shall be interpreted as illustrative only and not limiting. Changes in detail or structure may be made without departing from the spirit of the disclosure as defined in the appended claims.

When introducing elements of the present disclosure or the preferred embodiment(s) thereof, the articles "a", "an", "the", and "said" are intended to mean that there are one or more of the elements. The terms "comprising", "including", and "having" are intended to be inclusive and mean that there may be additional elements other than the listed elements.

As various changes could be made in the above constructions without departing from the scope of the disclosure, it is intended that all matter contained in the above description or shown in the accompanying drawings shall be interpreted as illustrative and not in a limiting sense.

What is claimed is:

1. Pulse pattern detecting circuitry for use with a fractional voltage multiplier of a neurostimulation system, the pulse pattern detecting circuitry configured to:
   activate, simultaneously, a plurality of pulse engines that generate pulses at different frequencies to establish a repeating pulse pattern;
   detect, using analog circuitry or digital circuitry communicatively coupled to both the plurality of pulse engines and the fractional voltage multiplier, an initial overlap of the repeating pulse pattern, the initial overlap occurring when pulses generated by each of the plurality of pulse engines occur simultaneously;
   detect, using the analog circuitry or the digital circuitry, a subsequent overlap of the repeating pulse pattern, the subsequent overlap of the pulse pattern occurring when pulses generated by each of the plurality of pulse engines again occur simultaneously;
   detect, using the analog circuitry or the digital circuitry, a length of the repeating pulse pattern, the length corresponding to the time between the detected initial overlap and the detected subsequent overlap;
   detect, using the analog circuitry or the digital circuitry, a plurality of events occurring over the length of the repeating pulse pattern between the initial overlap and the subsequent overlap, each event corresponding to at least one of the plurality of pulse engines generating a pulse;
   record, using the analog circuitry or the digital circuitry, a voltage multiplier setting for each of the plurality of detected events that occurs over the length of the repeating pulse pattern; and
   control, by transmitting signals from the analog circuitry or the digital circuitry to the fractional voltage multiplier, the fractional voltage multiplier based on the recorded voltage multiplier settings.

2. The pulse pattern detecting circuitry of claim 1, wherein the pulse pattern detecting circuitry comprises the analog circuitry.

3. The pulse pattern detecting circuitry of claim 2, wherein the analog circuitry comprises:
   a counter circuit configured to increment each time an event occurs; and
   a pulse generating circuit configured to cause the counter circuit to increment.

4. The pulse pattern detecting circuitry of claim 3, wherein the analog circuitry further comprises:
   an OR circuit coupled to the pulse generating circuit, the OR circuit configured to cause the pulse generating circuit to generate an output pulse whenever a pulse is detected.

5. The pulse pattern detecting circuitry of claim 3, wherein the analog circuitry further comprises:
   an AND circuit coupled to the counter circuit, the AND circuit configured to reset the counter circuit when the subsequent overlap occurs.

6. The pulse pattern detecting circuitry of claim 1, wherein the pulse pattern circuitry comprises the digital circuitry.

7. A neurostimulation system comprising:
   a plurality of pulse engines configured to generate a repeating pulse pattern by generating pulses at different frequencies; and
   pulse pattern detecting circuitry coupled to the plurality of pulse engines, the pulse pattern detecting circuitry configured to:
      detect, using analog circuitry or digital circuitry communicatively coupled to both the plurality of pulse engines and a fractional voltage multiplier, an initial overlap of the repeating pulse pattern, the initial overlap occurring when pulses generated by each of the plurality of pulse engines occur simultaneously;
      detect, using the analog circuitry or the digital circuitry, a subsequent overlap of the repeating pulse pattern, the subsequent overlap of the pulse pattern occurring when pulses generated by each of the plurality of pulse engines again occur simultaneously;
      detect, using the analog circuitry or the digital circuitry, a length of the repeating pulse pattern, the length corresponding to the time between the detected initial overlap and the detected subsequent overlap;
      detect, using the analog circuitry or the digital circuitry, a plurality of events occurring over the length of the repeating pulse pattern between the initial overlap and the subsequent overlap, each event corresponding to at least one of the plurality of pulse engines generating a pulse;
      record, using the analog circuitry or the digital circuitry, a voltage multiplier setting for each of the plurality of detected events that occurs over the length of the repeating pulse pattern; and
      control, by transmitting signals from the analog circuitry or the digital circuitry to the fractional voltage multiplier, the fractional voltage multiplier based on the recorded voltage multiplier settings.

8. The neurostimulation system of claim 7, wherein the pulse pattern detecting circuitry comprises the analog circuitry.

9. The neurostimulation system of claim 8, wherein the analog circuitry comprises:
   a counter circuit configured to increment each time an event occurs; and a pulse generating circuit configured to cause the counter circuit to increment.

10. The neurostimulation system of claim 9, wherein the analog circuitry further comprises:
an OR circuit coupled to the pulse generating circuit, the OR circuit configured to cause the pulse generating circuit to generate an output pulse whenever a pulse is detected.

11. The neurostimulation system of claim 9, wherein the analog circuitry further comprises:
an AND circuit coupled to the counter circuit, the AND circuit configured to reset the counter circuit when the subsequent overlap occurs.

12. The neurostimulation system of claim 7, wherein the pulse pattern detecting circuitry comprises the digital circuitry.

13. The neurostimulation system of claim 7, wherein the circuitry is further configured to:
activate the plurality of pulse engines simultaneously.

14. A method of operating a neurostimulation system, the method comprising:
generating a repeating pulse pattern using a plurality of pulse engines that generate pulses at different frequencies;
detecting, using pulse pattern detecting circuitry including analog circuitry or digital circuitry communicatively coupled to both the plurality of pulse engines and a fractional voltage multiplier, an initial overlap of the repeating pulse pattern, the initial overlap occurring when pulses generated by each of the plurality of pulse engines occur simultaneously;
detecting, using the analog circuitry or the digital circuitry, a subsequent overlap of the repeating pulse pattern, the subsequent overlap of the pulse pattern occurring when pulses generated by each of the plurality of pulse engines again occur simultaneously;
detecting, using the analog circuitry or the digital circuitry, a length of the repeating pulse pattern, the length corresponding to the time between the detected initial overlap and the detected subsequent overlap;
detecting, using the analog circuitry or the digital circuitry, a plurality of events occurring over the length of the repeating pulse pattern between the initial overlap and the subsequent overlap, each event corresponding to at least one of the plurality of pulse engines generating a pulse;
recording, using the analog circuitry or the digital circuitry, a voltage multiplier setting for each of the plurality of detected events that occurs over the length of the repeating pulse pattern; and
controlling, by transmitting signals from the analog circuitry or the digital circuitry to the fractional voltage multiplier, the fractional voltage multiplier based on the recorded voltage multiplier settings.

15. The method of claim 14, wherein the circuitry includes the analog circuitry.

16. The method of claim 15, wherein the analog circuitry includes:
a counter circuit configured to increment each time an event occurs; and
a pulse generating circuit configured to cause the counter circuit to increment.

17. The method of claim 16, wherein the analog circuitry further includes:
an OR circuit coupled to the pulse generating circuit, the OR circuit configured to cause the pulse generating circuit to generate a pulse whenever a pulse is detected.

18. The method of claim 14, wherein the circuitry includes the digital circuitry.

* * * * *